US010551672B2

(12) United States Patent
Yoon et al.

(10) Patent No.: US 10,551,672 B2
(45) Date of Patent: Feb. 4, 2020

(54) DISPLAY DEVICE

(71) Applicant: Samsung Display Co., Ltd, Yongin-si, Gyeonggi-do (KR)

(72) Inventors: Seontae Yoon, Seoul (KR); Junghyun Kwon, Seoul (KR); Donguk Kim, Hwaseong-si (KR); Haeil Park, Seoul (KR); Junhan Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 12 days.

(21) Appl. No.: 15/459,452

(22) Filed: Mar. 15, 2017

(65) Prior Publication Data
US 2017/0269435 A1    Sep. 21, 2017

(30) Foreign Application Priority Data

Mar. 16, 2016    (KR) .......................... 10-2016-0031332

(51) Int. Cl.
*G02F 1/1335*    (2006.01)
*G02F 1/1362*    (2006.01)
*G02F 1/1333*    (2006.01)

(52) U.S. Cl.
CPC .. *G02F 1/133617* (2013.01); *G02F 1/133377* (2013.01); *G02F 1/133512* (2013.01); *G02F 1/133528* (2013.01); *G02F 1/133553* (2013.01); *G02F 1/136286* (2013.01)

(58) Field of Classification Search
CPC ..................... G02F 1/133377; G02F 1/136209
See application file for complete search history.

(56) References Cited

U.S. PATENT DOCUMENTS

| | | | | |
|---|---|---|---|---|
| 6,124,907 A | * | 9/2000 | Jones | G02B 5/3033 349/106 |
| 2007/0182874 A1 | * | 8/2007 | Kamijima | G02F 1/136209 349/44 |
| 2012/0147314 A1 | * | 6/2012 | Yoshizawa | G02B 5/201 349/144 |
| 2012/0300141 A1 | * | 11/2012 | Shin | G02B 27/2214 349/15 |
| 2012/0326590 A1 | * | 12/2012 | Park | G02B 27/26 313/112 |
| 2013/0242228 A1 | * | 9/2013 | Park | G02F 1/133617 349/61 |

(Continued)

FOREIGN PATENT DOCUMENTS

| KR | 10-2013-0000506 A | 1/2013 |
|---|---|---|
| KR | 10-2014-0021258 A | 2/2014 |
| KR | 10-2014-0074495 A | 6/2014 |

*Primary Examiner* — Alexander P Gross
(74) *Attorney, Agent, or Firm* — Innovation Counsel LLP

(57) ABSTRACT

A display device includes: a first substrate; a second substrate facing the first substrate; a light amount control layer between the first substrate and the second substrate; a first line disposed on the first substrate and extending in a first direction and a second line disposed on the first substrate and extending in a second direction which intersects the first direction; a light blocking member disposed on the first substrate and overlapping at least one of the first line and the second line; a plurality of color conversion layers on the second substrate in respective pixel areas; and a partition wall among the plurality of color conversion layers, corresponding to the first line and the second line. The partition wall has a width less than a width of the light blocking member.

20 Claims, 12 Drawing Sheets

(56) References Cited

U.S. PATENT DOCUMENTS

| | | |
|---|---|---|
| 2014/0043566 A1 | 2/2014 | Lee et al. |
| 2014/0092353 A1* | 4/2014 | Matsushima ..... G02F 1/133512 349/110 |
| 2014/0160408 A1 | 6/2014 | Cho et al. |
| 2015/0205142 A1* | 7/2015 | Kim ...................... G02B 27/26 349/15 |
| 2017/0170241 A1* | 6/2017 | Huang .................. H01L 27/322 |
| 2017/0176817 A1* | 6/2017 | Tseng ................ G02F 1/133345 |

* cited by examiner

DISPLAY DEVICE

CROSS-REFERENCE TO RELATED APPLICATION

This application claims priority under 35 U.S.C. § 119 to Korean Patent Application No. 10-2016-0031332, filed on Mar. 16, 2016, in the Korean Intellectual Property Office (KIPO), the disclosure of which is incorporated by reference herein in its entirety.

1. Technical Field

Exemplary embodiments relate to a display device, and more particularly, to a display device including a color conversion layer configured to improve light efficiency.

2. Discussion of Related Art

Display devices are classified into a liquid crystal display ("LCD") device, an organic light emitting diode ("OLED") display device, a plasma display panel ("PDP") device, an electrophoretic display ("EPD") device, and the like, based on a light emitting scheme thereof.

Another example of the display devices is a photoluminescent display ("PLD") device, which includes a fluorescent pattern substituted for a color filter pattern which is used in conventional display devices. When light is transmitted through each color filter (e.g., one of a red color filter R, a green color filter G, and a blue color filter B) in the conventional display device, an amount of the light may decrease to about ⅓ of an initial light due to the color filter. In order to address such an issue, the PLD device may represent colors using a color conversion layer including a fluorescent element in lieu of the color filter. Display devices that employ such a color conversion layer including a fluorescent element are advantageous in that viewing angle properties may be improved and high color reproducibility may be achieved, but they require twice as much energy as that required by the conventional display devices to have a predetermined front luminance.

Accordingly, it is necessary that display devices that employ the color conversion layer including fluorescent elements have a structure that may improve light extraction efficiency.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments may be directed to a display device improved in terms of light efficiency by modifying a configuration of a color conversion layer without an additional process.

According to an exemplary embodiment, a display device includes: a first substrate; a second substrate facing the first substrate; a light amount control layer between the first substrate and the second substrate; a first line disposed on the first substrate and extending in a first direction and a second line disposed on the first substrate and extending in a second direction which intersects the first direction; a light blocking member disposed on the first substrate and overlapping at least one of the first line and the second line; a plurality of color conversion layers on the second substrate in respective pixel areas; and a partition wall among the plurality of color conversion layers, corresponding to the first line and the second line. The partition wall has a width less than a width of the light blocking member.

The display device may further include a polarizer between the second substrate and the light amount control layer.

The color conversion layer may be on a lower surface of the second substrate.

The display device may further include a dichroic reflection layer between the color conversion layer and the polarizer.

The display device may further include a polarizer above the second substrate.

The color conversion layer may be above an upper surface of the second substrate.

The color conversion layer may be between the second substrate and the polarizer.

The polarizer may be between the second substrate and the color conversion layer.

The display device may further include a third substrate above the color conversion layer.

The color conversion layer may further include a low refractive index layer.

The low refractive index layer may be on surfaces of the color conversion layer except a surface of the color conversion layer facing the light amount control layer and disposed adjacent to the light amount control layer.

A portion of the partition wall overlapping the second line may have a width greater than a width of a portion of the partition wall overlapping the first line.

The first line may be a gate line, and the color conversion layer may have substantially a same color in an upper portion and a lower portion with respect to the gate line.

The first line may be a data line, and the color conversion layer may have substantially a same color in a left portion and a right portion with respect to the data line.

The color conversion layer may include a phosphor in an area defined by the partition wall.

The phosphor may include at least one of a red phosphor, a green phosphor, and a blue phosphor.

The color conversion layer may include a phosphor and a transparent layer.

The display device may further include a thin film transistor at an intersecting area between the first line and the second line; and a pixel electrode connected to the thin film transistor.

The light amount control layer may include liquid crystal molecules.

The light amount control layer may include a blue organic light emitting layer.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the inventive concept will become more apparent by describing in detail exemplary embodiments thereof with reference to the accompanying drawings, wherein.

DETAILED DESCRIPTION

Figure 1:
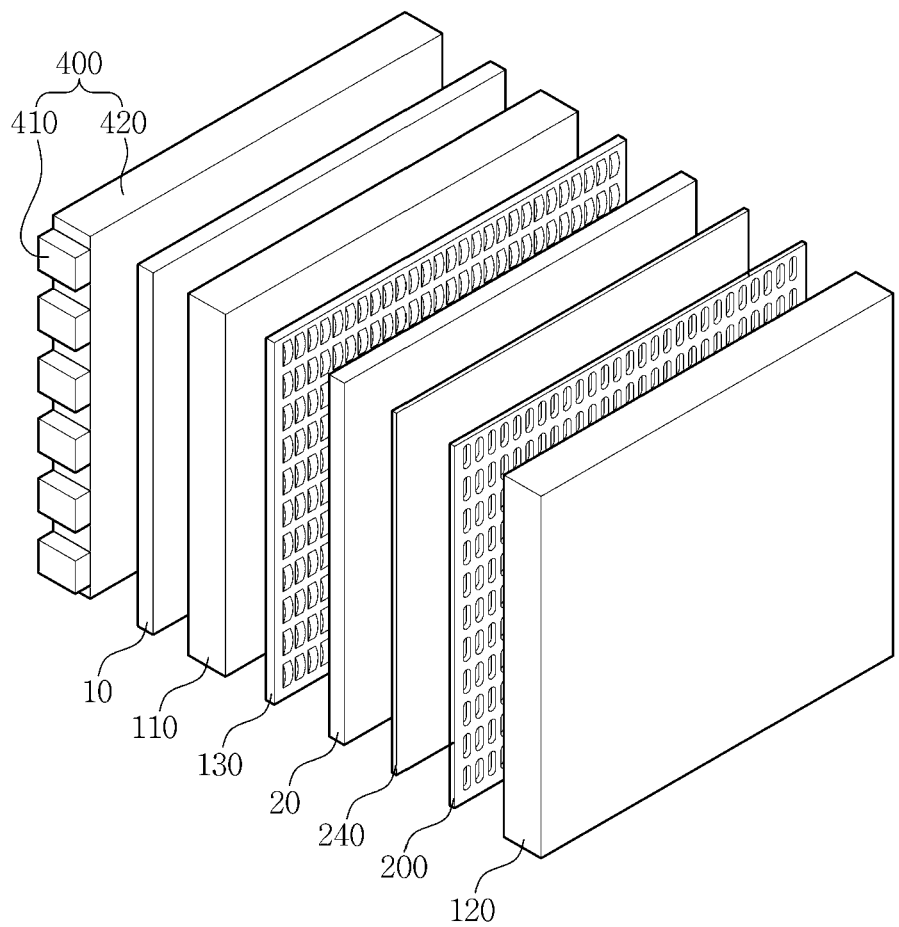
FIG. 1 is an exploded perspective view illustrating a display device according to a first exemplary embodiment.

Features of the inventive concept and methods for achieving them will be made clear from exemplary embodiments described below in detail with reference to the accompanying drawings. The inventive concept may, however, be embodied in many different forms and should not be construed as being limited to the exemplary embodiments set forth herein. Rather, these exemplary embodiments are provided so that this disclosure will be thorough and complete, and will fully convey the scope of the inventive concept to those skilled in the art. The inventive concept is merely defined by the scope of the claims. Therefore, well-known constituent elements, operations and techniques are not described in detail in the exemplary embodiments in order to prevent the inventive concept from being obscurely interpreted. Like reference numerals refer to like elements throughout the specification.

In the drawings, certain elements or shapes may be illustrated in an enlarged manner or in a simplified manner to better illustrate the inventive concept, and other elements present in an actual product may also be omitted. Thus, the drawings are intended to facilitate the understanding of the inventive concept.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have a same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to a first exemplary embodiment will be described in detail with reference to FIGS. 1, 2, 3, 4, and 5.

Figure 2:
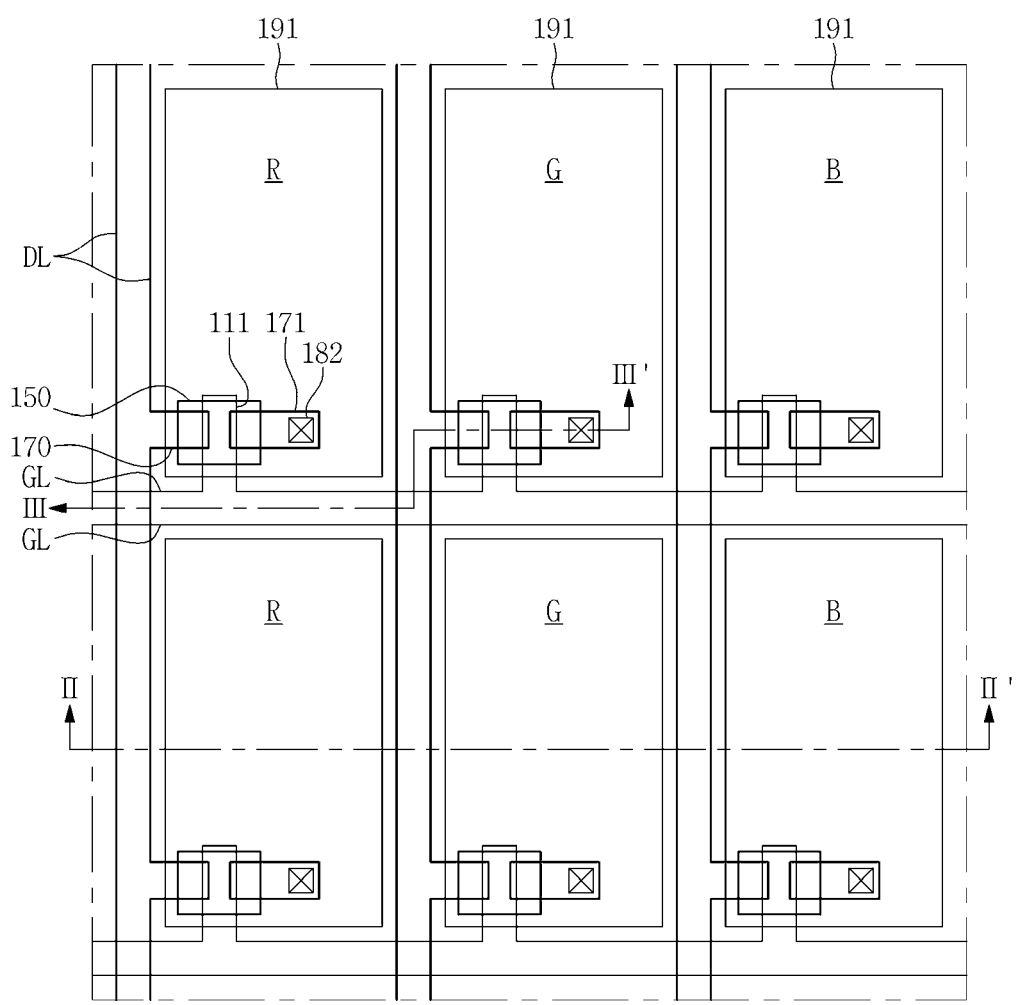
FIG. 2 is a schematic plan view illustrating a pixel of the display device of FIG. 1.
Figure 3:
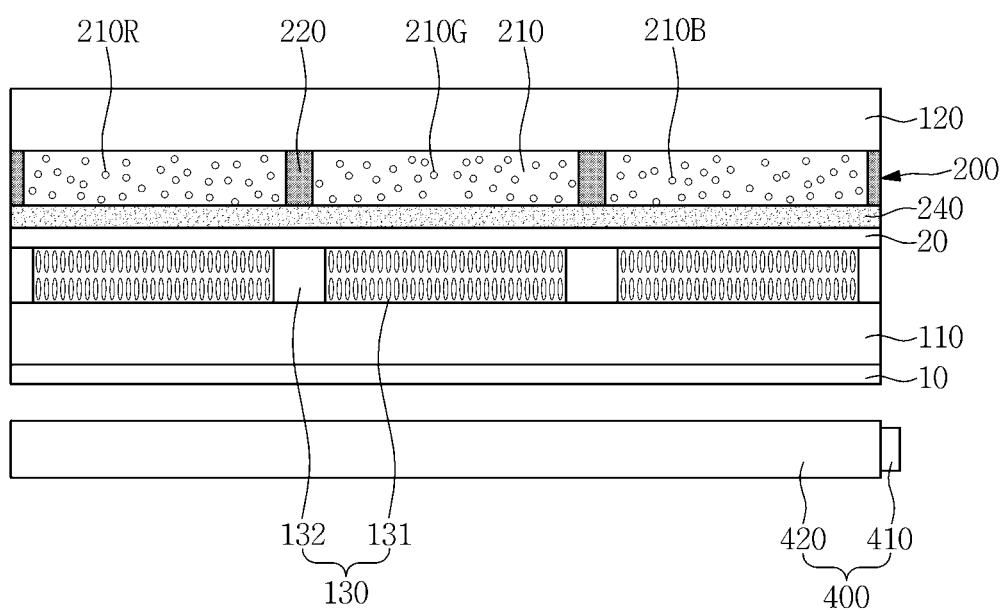
FIG. 3 is a cross-sectional view taken along line II-II' of FIG. 2.
Figure 4:
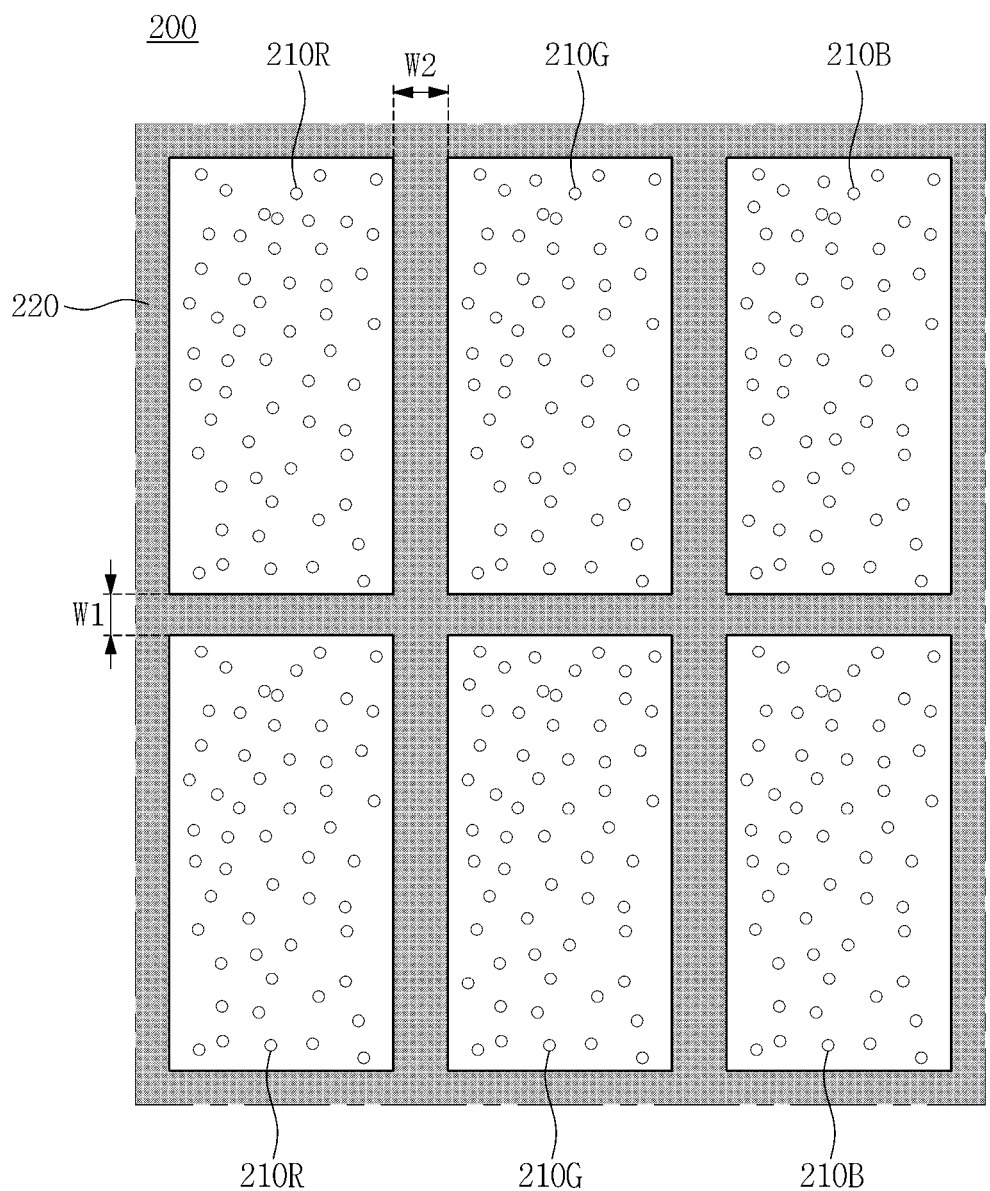
FIG. 4 is a plan view illustrating a color conversion layer of the display device according to the first exemplary embodiment.
Figure 5:
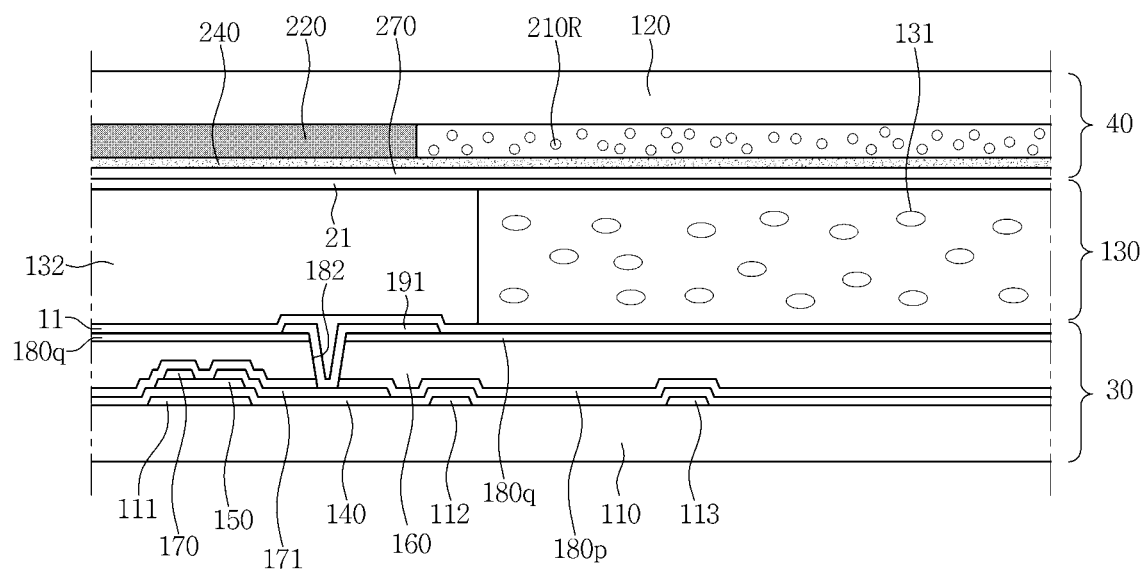
FIG. 5 is a cross-sectional view taken along line III-III' of FIG. 2.

FIG. 1 is an exploded perspective view illustrating a display device according to a first exemplary embodiment, FIG. 2 is a schematic plan view illustrating a pixel of the display device of FIG. 1, FIG. 3 is a cross-sectional view taken along line II-II' of FIG. 2, FIG. 4 is a plan view illustrating a color conversion layer of the display device according to the first exemplary embodiment, and FIG. 5 is a cross-sectional view taken along line of FIG. 2.

The display device includes: a first substrate; a first line on the first substrate and extending in a first direction; a second line on the first substrate and extending in a second direction which intersects the first direction; and a light blocking member on the first substrate and overlapping at least one of the first line and the second line.

In descriptions pertaining to the display device according to the first exemplary embodiment, a gate line GL, a data line DL, and a gate light blocking member are to be described as the first line, the second line, and the light blocking member, respectively, by way of example.

Referring to FIGS. 1, 2, and 3, the display device includes: a first substrate 110; a light amount control layer 130 on the first substrate 110; a second substrate 120 on the light blocking layer 130 and opposing the first substrate 110; a backlight unit 400 below the first substrate 110; a first polarizer 10 below the first substrate 110; and a second polarizer 20 on the light amount control layer 130.

The second substrate 120 includes a plurality of color conversion layers 200 in a plurality of pixel areas, respectively.

The first substrate 110 and the second substrate 120 may include transparent materials such as glass or plastic.

The light amount control layer 130 and the plurality of color conversion layers 200 are disposed between the first substrate 110 and the second substrate 120. The color conversion layer 200 is disposed on the light amount control layer 130.

The display device includes a plurality of pixels, and the plurality of pixels may be arranged in a matrix form from a plane.

The backlight unit 400 is disposed below the first substrate 110. The backlight unit 400 includes a light source 410 and a light guide plate 420. The backlight unit 400 may irradiate ultraviolet light, rear ultraviolet light, or blue light.

A dichroic reflection layer 240 is disposed below the color conversion layer 200. The dichroic reflection layer 240 may include a dichroic filter.

The dichroic filter may serve to reflect a second light having a different wavelength from a wavelength of a first light incident thereto, and to transmit in a selective manner a light having substantially a same wavelength as that of the first light. The first light corresponds to a blue light emitted from the light source 410, and the second light having a different wavelength from that of the first light corresponds to a red light or a green light converted in terms of wavelength by the color conversion layer 200.

Among the second light emitted from the color conversion layer 200, a light emitted toward a rear portion of a display panel is reflected by the dichroic reflection layer 240 to be emitted toward the front of the display panel.

The dichroic reflection layer 240 has a multilayer structure in which high refractive index thin films and low refractive index thin films are alternately stacked. The dichroic reflection layer 240 may serve a selective light transmitting function based on its high reflectance which may be obtained by a multilayer interference phenomenon. The low refractive index thin film may include $MgF_2$ and $SiO_2$, for example, and the high refractive index thin film may include Ag, $TiO_2$, $Ti_2O_3$, and $Ta_2O_3$, for example, but exemplary embodiments are not limited thereto. A thickness of each of the thin films may be determined in a range of about ⅛ to about ½ of a wavelength of transmitted light.

In a case where the dichroic reflection layer 240 has a multilayer structure in which a plurality of dielectric thin films, each having different refractive indices, are stacked, the multilayer interference phenomenon may arise in the dichroic reflection layer 240 due to a mirror surface which has significantly higher reflectance than that of metal. Such a dichroic reflection layer 240 may also be referred to as an edge filter in an optical field, and may be designed to have a reflectance that radically changes with respect to a predetermined wavelength.

The dichroic reflection layer 240 may improve light efficiency by transmitting and/or reflecting a light of a predetermined wavelength in a selective manner based on a configuration of the dielectric thin film. For example, in a case where the first light incident to the color conversion layer 200 is blue light, the dichroic reflection layer 240 may be designed to transmit the blue light, and reflect green light and red light. Accordingly, among green light and red light emitted from the color conversion layer 200, the second light emitted toward the rear portion of the display panel is reflected by the dichroic reflection layer 240 to be emitted toward the front of the display panel. Accordingly, the dichroic reflection layer 240 may enhance light efficiency of the color conversion layer 200.

When a surface of the first substrate 110 and a surface of the second substrate 120 that face each other are defined as inner surfaces of the corresponding substrates 110, 120, respectively, and surfaces opposite to the inner surfaces are defined as outer surfaces of the corresponding substrates 110, 120, respectively, the first polarizer 10 is disposed on the outer surface of the first substrate 110 and the second polarizer 20 is disposed on the inner surface of the second substrate 120. A transmission axis of the first polarizer 10 may be substantially orthogonal to a transmission axis of the second polarizer 20.

The light amount control layer 130 may include a plurality of liquid crystal molecules 131. The light amount control layer 130 may include a light blocking member 132 which defines a boundary among the plurality of pixels.

The plurality of color conversion layers 200 include a partition wall 220 which define a plurality of pixel areas from one another and a plurality of fluorescent elements (hereinafter, "phosphor") 210R, 210G, and 210B disposed in the plurality of pixel areas, respectively, defined by the partition wall 220.

The plurality of color conversion layers 200 may include a first color pixel, a second color pixel, and a third color pixel, for example. For example, the first color pixel may be a red pixel, the second color pixel may be a green pixel, and the third color pixel may be a blue pixel. The red pixel includes a red phosphor 210R, the green pixel includes a green phosphor 210G, and the blue pixel includes a blue phosphor 210B.

A light transmitted through the red pixel of the color conversion layer 200 represents a red color, a light transmitted through the green pixel thereof represents a green color, and a light transmitted through the blue pixel thereof represents a blue color.

The color conversion layer 200 may include a resin 210 including the phosphors 210R, 210G, and 210B. The phosphor is a material that emits, upon being irradiated with light, radiant light, or the like, fluorescent light having an intrinsic color of the corresponding phosphor regardless of the color of the light irradiated thereto. In addition, the light is emitted toward all directions regardless of the propagation direction of the light irradiated thereto.

In an exemplary embodiment, although not illustrated, the color conversion layer 200 may include a phosphor having a different color other than the above-described colors, and the phosphor may scatter light of a fourth color.

The phosphors 210R, 210G, and 210B of the color conversion layer 200 may include quantum dot particles. A quantum dot particle is a wavelength converting particle that converts a wavelength of a light to emit a desired light. A range of wavelength a quantum dot particle may convert varies based on the size of the quantum dot particle. Accordingly, a light of a desired color may be obtained by adjusting a diameter of the quantum dot particle.

The quantum dot particle has a high quantum yield and a high extinction coefficient which is about a hundred times to about a thousand times greater than an extinction coefficient of a general fluorescent element, and thus may emit significantly intense fluorescent light. In particular, the quantum dot particle may receive a light of a short wavelength and shift the short wavelength to emit a light of a longer wavelength.

The quantum dot particle may have a structure including a core nanocrystal and a shell nanocrystal surrounding the core nanocrystal. In an exemplary embodiment, the quantum dot particle may further include an organic ligand bonded to the shell nanocrystal. In an exemplary embodiment, the quantum dot particle may further include an organic coating layer surrounding the shell nanocrystal.

The shell nanocrystal may have two or more layers. The shell nanocrystal is formed on a surface of the core nanocrystal. Using the shell nanocrystal forming a shell layer, the quantum dot particle may lengthen a wavelength of a light incident to the core nanocyrstal, thus enhancing light efficiency.

The quantum dot particle may include at least one substance of group II compound semiconductors, group III compound semiconductors, group V compound semiconductors, and group VI compound semiconductors. For example, the core nanocrystal may include at least one of: PbSe, InAs, PbS, CdSe, InGaP, CdTe, CdS, ZnSe, ZnTe, ZnS, HgTe or HgS. Further, the shell nanocrystal may include at least one of: CuZnS, CdSe, CdTe, CdS, ZnSe, ZnTe, ZnS, HgTe or HgS.

For example, in a case where the core nanocrystal includes CdSe, a blue light may be emitted when a diameter of the quantum dot particle is in a range of about 1 nm to about 3 nm, a green light may be emitted when the diameter of the quantum dot is in a range of about 3 nm to about 5 nm, and a red light may be emitted when the diameter of the quantum dot is in a range of about 7 nm to about 10 nm.

A wavelength of light emitted from the quantum dot particle may be adjusted based on the size of the quantum dot particle or a molar ratio between a nanocrystal precursor and a molecular cluster compound in a fabrication process. An organic ligand serves to stabilize the quantum dot particle that is unstable after fabricated. Examples of the organic ligand may include pyridine, mercapto alcohol, thiol, phosphine, and phosphine oxide, for example. When fabricated, a quantum dot particle may have a dangling bond on an outer side thereof, and thus may become unstable. In such an example, however, an end of the organic ligand is in a non-bonding state, and the non-bonding end of the organic ligand may bond to the dangling bond such that the quantum dot particle may be stabilized.

The quantum dot particle may be fabricated in a wet-chemical method whereby a precursor material is put into an organic solvent such that the particle may grow. In an exemplary embodiment, the quantum dot particle may be fabricated through the wet-chemical method.

In an exemplary embodiment, the partition wall 220 of the color conversion layer 200 may have a lattice form corresponding to the gate line GL and the data line DL on the first substrate 110.

Hereinafter, the partition wall 220 of the color conversion layer 200 in the display device according to the first exemplary embodiment will be described with reference to FIGS. 2 and 4.

First, referring to FIG. 2, the display device according to the first exemplary embodiment includes the gate line GL extending in a horizontal direction, the data line DL extending in a vertical direction which intersects the horizontal direction, a thin film transistor ("TFT") at intersecting areas between the gate line GL and the data line DL, and a first electrode 191 connected to the TFT.

As illustrated in FIG. 2, the red pixel R, the green pixel G, and the blue pixel B are arranged in a line to form a pixel. Pixels of substantially a same color are disposed in an upper portion and a lower portion with respect to the gate line GL, and pixels of different colors are disposed in a left portion and a right portion with respect to the data line DL, respectively. For example, the red pixels R may be disposed in the upper portion and the lower portion, and the blue pixel B may be disposed on the left side of the red pixel R, and the green pixel G may be disposed on the right side of the red pixel R.

As described above, the plurality of color conversion layers 200 include the partition wall 220 which defines the plurality of pixel areas from one another. The partition wall 220 of the color conversion layer 200 is disposed corresponding to an edge area of the pixel area to block light. The partition wall 220 is disposed to overlap at least one of the gate line GL and the data line DL.

For example, the partition wall 220 may overlap a light blocking member that overlaps at least one of the gate line GL and the data line DL. In an exemplary embodiment, an example of the partition wall 220 overlapping the gate light blocking member will be described by way of example.

In typical display devices, the gate light blocking member serves to control light leakage and photo leakage. In an exemplary embodiment of the display device, as the gate light blocking member controls light leakage in a lower display panel, it is unnecessary that the partition wall 220 of the color conversion layer 200 has substantially a same width as a width of the gate light blocking member.

The partition wall 220 of the color conversion layer 200 may have a width less and a breadth less than those of the gate light blocking member. However, exemplary embodiments are not limited thereto, and the partition wall 220 of the color conversion layer 200 may be omitted.

Referring to FIG. 4, the plurality of color conversion layers 200 include the partition wall 220 defining the plurality of pixel areas and the plurality of phosphors 210R, 210G, and 210B in the plurality of pixel areas defined by the partition wall 220.

As described hereinabove, the partition wall 220 may have a lattice form corresponding to the gate line GL and the data line DL. In addition, a portion of the partition wall 220 overlapping the data line DL may have a width greater than a width of a portion of the partition wall 220 overlapping the gate line GL.

As illustrated in FIG. 4, a portion of the partition wall 220 extending in a horizontal direction (hereinafter, a horizontal portion) and a portion of the partition wall 220 extending in a vertical direction (hereinafter, a vertical portion) intersect one another to form a lattice form.

In an exemplary embodiment, the horizontal portion of the partition wall 220 may correspond to the gate light blocking member and the vertical portion thereof may correspond to a data light blocking member. Accordingly, a width W2 of the vertical portion of the partition wall 220 may be greater than a width W1 of the horizontal portion of the partition wall 220 (W1<W2).

The width W1 of the horizontal portion of the partition wall 220 may be reduced, because pixels of substantially a same color are disposed in an upper portion and a lower portion with respect to the horizontal portion of the partition wall 220, thus not significantly affecting colors. However, because pixels of different colors are disposed in a left portion and a right portion with respect to the vertical portion of the partition wall 220 to affect colors, it is desirable that the width W2 of the vertical portion is substantially the same as a width of light blocking member.

According to the first exemplary embodiment, the gate line GL and the data line DL are described as the first line and the second line, respectively, by way of example. However, exemplary embodiments are not limited thereto, and the first line and the second line may be the data line DL and the gate line GL, respectively.

As described hereinabove, in an exemplary embodiment of the display device, as the partition wall 220 of the color conversion layer 200 is reduced, a light emission area may be expanded and light extraction efficiency may be improved.

Hereinbelow, a pixel of a display device will be described in detail with reference to FIG. 5.

The display device includes a lower display panel 30 and an upper display panel 40 opposing each other, and the light amount control layer 130 between the two display panels 30 and 40. In FIG. 5, the light amount control layer 130 will be described with respect to a liquid crystal layer, by way of example.

First, the lower display panel 30 will be described.

The gate line GL and a storage electrode line 112 are disposed along one direction on the first substrate 110. The first substrate 110 may include transparent materials such as glass or plastic.

The gate line GL largely extends in a horizontal direction and transmits a gate signal. A gate electrode 111 protrudes from the gate line GL.

The storage electrode line 112 extends in substantially a same direction as a direction in which the gate line GL extends, and a predetermined voltage is applied to the storage electrode line 112. A storage electrode 113 protrudes from the storage electrode line 112.

A gate insulating layer 140 is formed on the gate line GL, the storage electrode line 112, the gate electrode 111, and the storage electrode 113. The gate insulating layer 140 may include an inorganic insulating material such as silicon nitride ($SiN_x$) and silicon oxide ($SiO_2$). In addition, the gate insulating layer 140 may have a monolayer structure or a multilayer structure.

A semiconductor layer 150 is formed on the gate insulating layer 140. The semiconductor layer 150 may be disposed on the gate electrode 111. The semiconductor layer 150 may include amorphous silicon, polycrystalline silicon, and/or metal oxide.

An ohmic contact member (not illustrated) may further be formed on the semiconductor layer 150. The data line DL, a source electrode 170, and a drain electrode 171 are formed on the semiconductor layer 150 and the gate insulating layer 140. The semiconductor layer 150 may also be formed below the data line DL, as well as on the gate electrode 111.

The data line DL transmits a data voltage and largely extends in a vertical direction to intersect the gate line GL.

The source electrode 170 protrudes from the data line DL. The source electrode 170 may be curved into a C-like shape above the gate electrode 111.

The drain electrode 171 is disposed above the gate electrode 111 to be spaced apart from the source electrode 170. A channel is formed in an exposed portion of the semiconductor layer 150 between the source electrode 170 and the drain electrode 171 that are spaced apart from each other.

The gate electrode 111, the semiconductor layer 150, the source electrode 170, and the drain electrode 171, described hereinabove, define a switching element.

A first protection layer 180p is formed on the data line DL, the source electrode 170, the drain electrode 171, and an exposed portion of the semiconductor layer 150 between the source electrode 170 and the drain electrode 171. The first protection layer 180p may include an inorganic insulating material such as silicon nitride ($SiN_x$) and silicon oxide ($SiO_2$).

A planarization layer 160 is disposed on the first protection layer 180p. The planarization layer 160 may include at least one selected from the group consisting of: a polyacrylate resin, an epoxy resin, a phenolic resin, a polyamide resin, a polyimide resin, an unsaturated polyester resin, a poly-phenylenether resin, a poly-phenylenesulfide resin, and benzocyclobutene (BCB).

A second protection layer 180q is further formed on the planarization layer 160. The second protection layer 180q may include an inorganic insulating material such as silicon nitride ($SiN_x$) and silicon oxide ($SiO_2$). The second protection layer 180q may effectively reduce loosening off of the planarization layer 160 and contamination of the light amount control layer 130 from an organic material permeating from the planarization layer 160, thus effectively reducing defects such as image sticking that may occur when a screen is operated.

A contact hole 182 extending to and exposing the drain electrode 171 is defined in the first protection layer 180p, the planarization layer 160, and the second protection layer 180q.

The first electrode 191 is formed on the first protection layer 180q. The first electrode 191 is connected to the drain electrode 171 through the contact hole 182. The first electrode 191 receives a data voltage from the drain electrode 171.

The first electrode 191, applied with the data voltage, along with a second electrode 270 of the upper display panel 40 to be described hereinbelow, generates an electric field which may determine an orientation of the liquid crystal molecules 131 of the light amount control layer 130 between the first and second electrodes 191 and 270. Based on the orientation of the liquid crystal molecules 131, luminance of light transmitted through the light amount control layer 130 may vary.

The first electrode 191 and the second electrode 270, along with the light amount control layer 130 therebetween, form a liquid crystal capacitor to maintain the applied voltage even after the TFT is turned off.

The first electrode 191 may overlap the storage electrode line 112 as well as the storage electrode 113, thus forming a storage capacitor. The storage capacitor may enhance voltage maintaining capability of the liquid crystal capacitor.

A first alignment layer 11 is formed on the first electrode 191. The first alignment layer 11 may be a vertically-aligned alignment layer or an alignment layer that is photo-aligned using a photo-polymerizable material.

Hereinafter, the upper display panel 40 will be described.

The second electrode 270 is disposed on the second substrate 120. The second electrode 270 may include a transparent metal material such as ITO and IZO. A predetermined voltage may be applied to the second electrode 270, and an electric field may be generated between the first electrode 191 and the second electrode 270.

A second alignment layer 21 is formed on the second electrode 270. The second alignment layer 21 may be a vertically-aligned alignment layer or an alignment layer that is photo-aligned using a photopolymerizable material.

Hereinafter, second and third exemplary embodiments will be described with reference to FIGS. 6 and 7.

Figure 6:
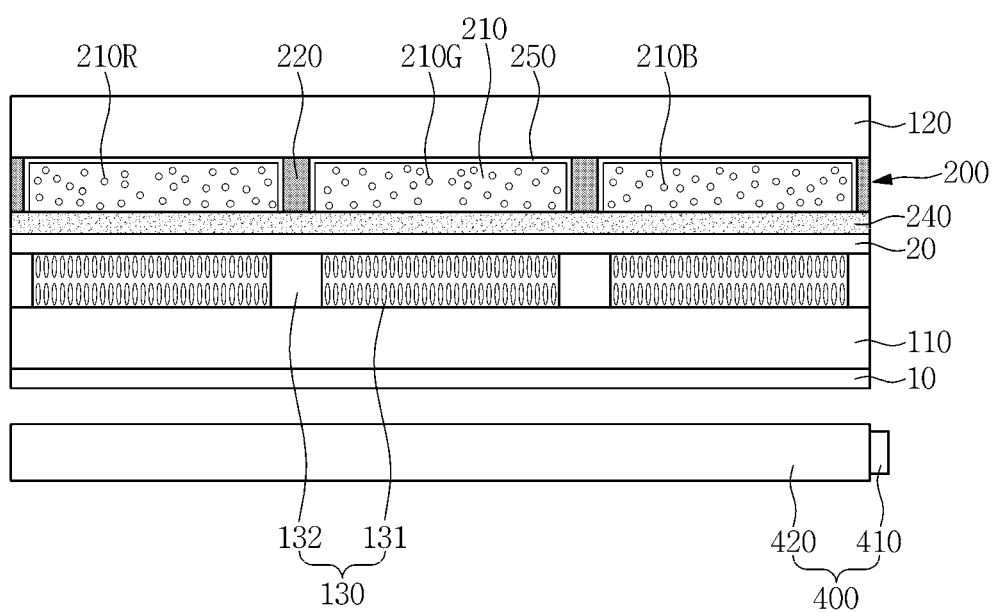
FIG. 6 is a cross-sectional view illustrating a display device according to a second exemplary embodiment.
Figure 7:
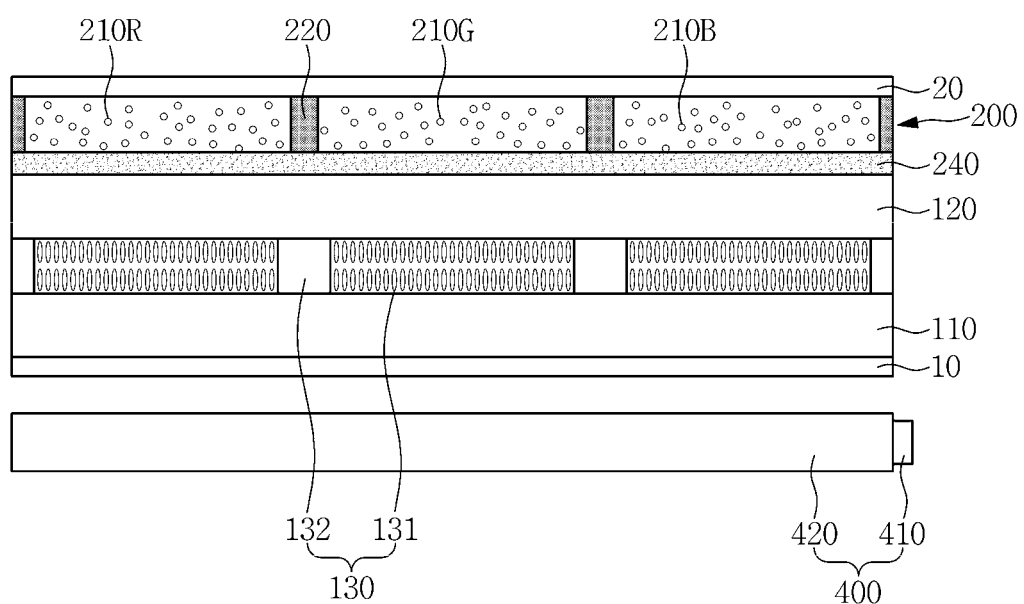
FIG. 7 is a cross-sectional view illustrating a display device according to a third exemplary embodiment.

FIG. 6 is a cross-sectional view illustrating a display device according to a second exemplary embodiment, and FIG. 7 is a cross-sectional view illustrating a display device according to a third exemplary embodiment.

Referring to FIG. 6, a color conversion layer 200 further includes a low refractive index layer 250. For example, the low refractive index layer 250 is provided on at least one side of the color conversion layer 200 to cover at least a portion of the color conversion layer 200.

The low refractive index layer 250 reflects a first light toward the color conversion layer 200, in order to increase frequency of use of the first light in the color conversion layer 200. On the contrary, the low refractive index layer 250 transmits a light in a visible ray range to be directly perceived by an eye of a user. According to the second exemplary embodiment, as illustrated in FIG. 6, the low refractive index layer 250 may cover surfaces of the color conversion layer 200, except a surface thereof facing a light amount control layer 130. That is, the low refractive index layer 250 may cover a surface opposite to the surface of the color conversion layer 200 facing the light amount control layer 130 and the entirety of surfaces contacting a partition wall 220. For example, the low refractive index layer 250 is disposed between the second substrate and the resins including the phosphors 210R, 210G, 210B, the partition wall 220 and the resins including the phosphors 210R, 210G, 210B. The low refractive index layer 250 may include a dielectric thin film. That is, the low refractive index layer 250 includes a thin film having a low refractive index, thus forming a half mirror that reflects light of a predetermined wavelength. The thin film may include various inorganic materials, e.g., silicon oxide, titanium oxide, and silicon nitride.

Configurations of the second exemplary embodiment are substantially the same as configurations of the first exemplary embodiment, except that the low refractive index layer 250 is provided between the color conversion layer 200 and a second substrate 120. As the color conversion layer 200 further includes the low refractive index layer 250, light efficiency may be improved.

Referring to FIG. 7, the color conversion layer 200 and a dichroic reflection layer 240 may be disposed on an upper surface of the second substrate 120. The color conversion layer 200 and the dichroic reflection layer 240 may be disposed between the second substrate 120 and a second polarizer 20.

In a display device according to a third exemplary embodiment, a color conversion layer 200 and a dichroic reflection layer 240 are disposed in a different manner from the disposition of the color conversion layer 200 and the dichroic reflection layer 240 in the display device according to the first exemplary embodiment. Although the positions of the color conversion layer 200 and the dichroic reflection layer 240 are changed, a light extraction area is expanded as in the first exemplary embodiment.

Hereinafter, a display device according to a fourth exemplary embodiment will be described with reference to FIGS. 8 and 9. According to the fourth exemplary embodiment, a color conversion layer 200 may be disposed above a second substrate 120, and a second polarizer 20 may be disposed between the color conversion layer 200 and the second substrate 120.

Figure 8:
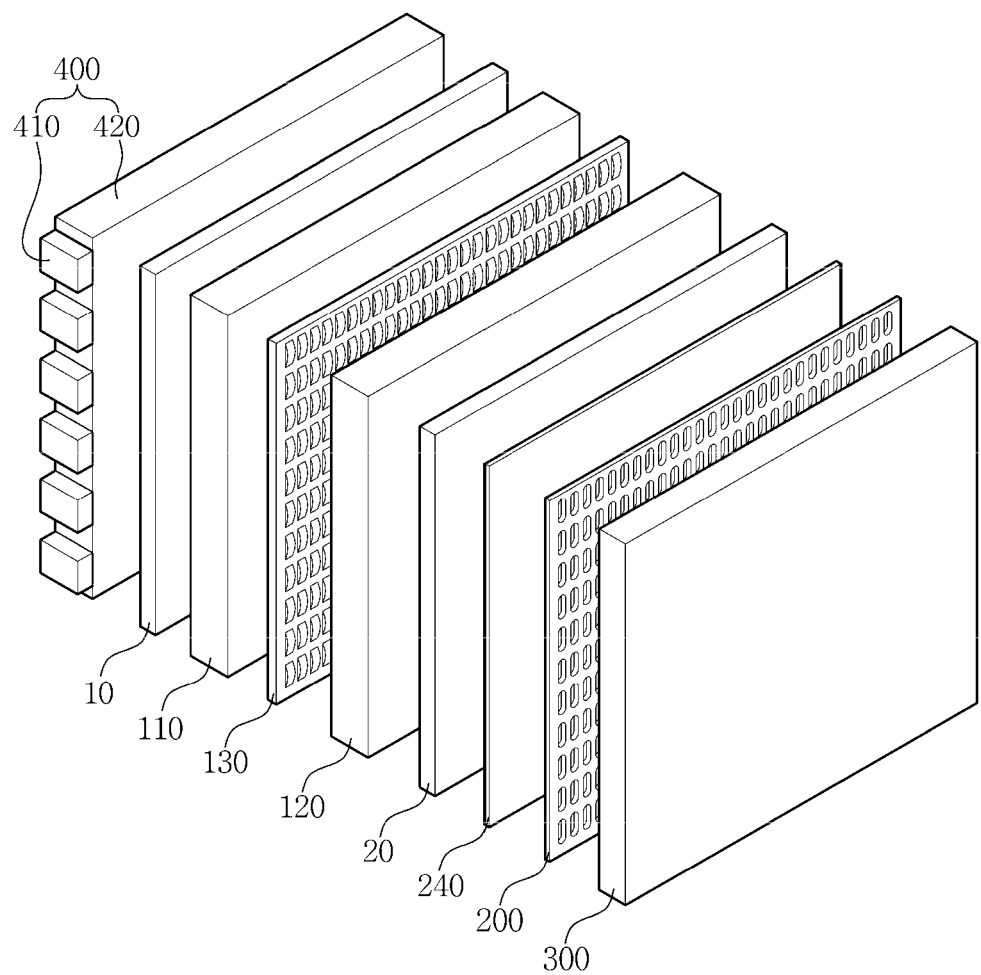
FIG. 8 is an exploded perspective view illustrating a display device according to a fourth exemplary embodiment.
Figure 9:
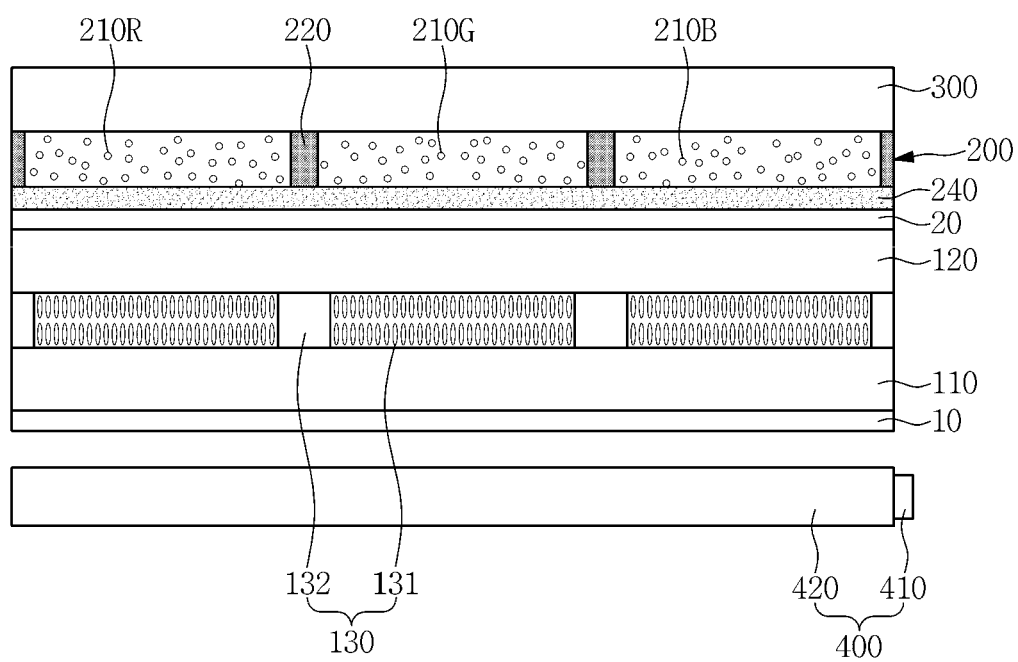
FIG. 9 is a schematic cross-sectional view illustrating the display device of FIG. 8.

FIG. 8 is an exploded perspective view illustrating the display device according to the fourth exemplary embodiment, and FIG. 9 is a schematic cross-sectional view illustrating the display device of FIG. 8.

Referring to FIGS. 8 and 9, the display device further includes a third substrate 300.

The third substrate 300 may include transparent materials such as glass or plastic. The third substrate 300 may be a protective glass. The color conversion layer 200 and a dichroic reflection layer 240 are disposed between the second substrate 120 and the third substrate 300. The color conversion layer 200 and the dichroic reflection layer 240 are formed on the third substrate 300 in a separate manner and then may be attached on the second substrate 120.

Hereinafter, a display device according to a fifth exemplary embodiment will be described with reference to FIG. 10.

Figure 10:
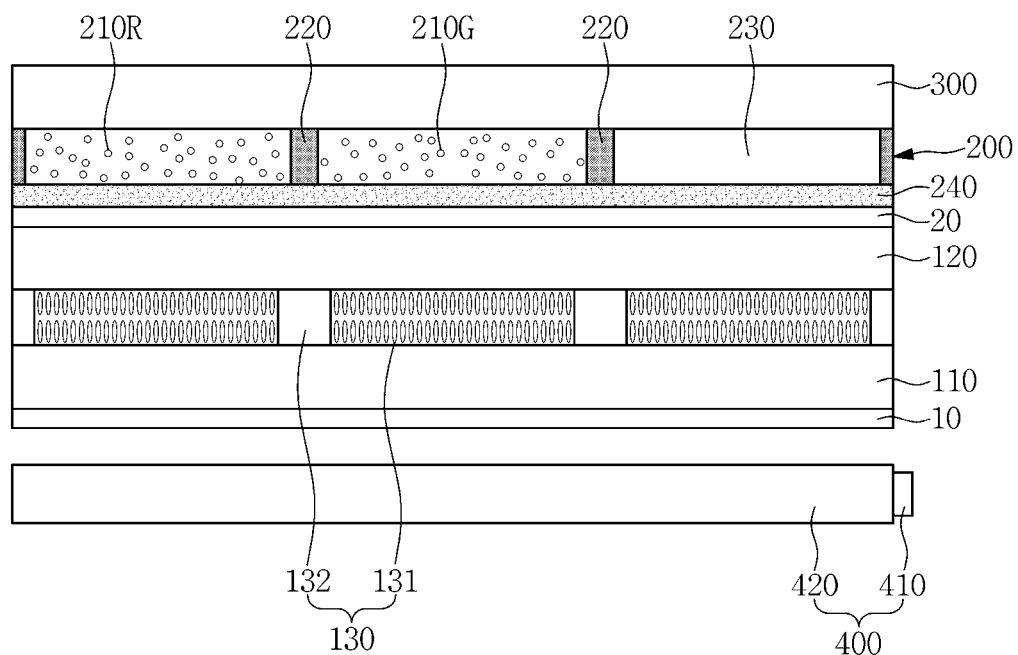
FIG. 10 is a cross-sectional view illustrating a display device according to a fifth exemplary embodiment.

FIG. 10 is a cross-sectional view illustrating the display device according to the fifth exemplary embodiment.

Referring to FIG. 10, a transparent layer 230 of a color conversion layer 200 is a transparent transmissive layer not having any color. The transparent layer 230 may include a colorless transparent resin or may be void, not including any material.

The transparent layer 230 corresponds to a blue pixel of the color conversion layer 200 and blue light propagating through a first substrate 110 and a light amount control layer 130 may be intactly transmitted therethrough, such that luminance of the blue light may increase. In addition, in a case where the transparent layer 230 is void (i.e., does not include any material), a separate process for manufacturing a blue pixel is unnecessary such that a manufacturing process may be simplified and manufacturing costs may be reduced.

Hereinafter, a display device according to a sixth exemplary embodiment will be described with reference to FIG. 11. Configurations of the display device according to the sixth exemplary embodiment are substantially the same as those of the display device according to the first exemplary embodiment, except that a first polarizer 10 is an in-cell polarizer that is disposed in a display panel. Descriptions pertaining to the same configurations described hereinabove will be omitted, for ease of description.

Figure 11:
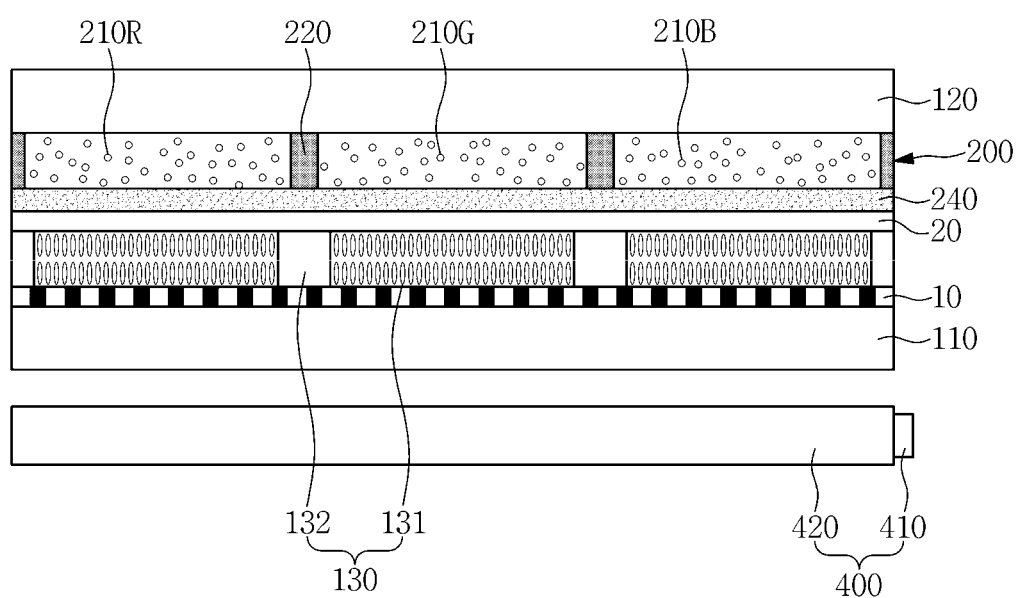
FIG. 11 is a cross-sectional view illustrating a display device according to a sixth exemplary embodiment.

FIG. 11 is a cross-sectional view illustrating the display device according to the sixth exemplary embodiment.

Referring to FIG. 11, in the display device according to the sixth exemplary embodiment, the first polarizer 10 is disposed above a first substrate 110.

The first polarizer 10 has a structure in which a wire grid pattern is formed on a red pixel, a green pixel, and a blue pixel in a unit pixel. The wire grid pattern is a stripe pattern having a line width less and a gap less than wavelengths of a red light, a green light, and a blue light within a wavelength range of visible light that humans can perceive. When light is incident to the wire grid pattern, a polarized light parallel to the wire grid pattern is reflected and a polarized light perpendicular to the wire grid pattern is transmitted therethrough.

The wire grid pattern may be formed in the following manner: in a state that an imprinting resin, including a conductive material, is formed on a substrate, imprinting is repeatedly performed on the imprinting resin using a stamp formed with a wire grid pattern. In an alternative exemplary embodiment, the wire grid pattern may be formed through a lithography process, based on laser interference, using a mask having a pattern corresponding to the wire grid pattern.

As illustrated in FIG. 11, the wire grid pattern of the first polarizer 10 is depicted as having substantially a same width and substantially a same gap in each pixel, but the width and the gap of the wire grid pattern may vary corresponding to respective colors of the pixels.

The wire grid pattern may be designed to have suitable values for the pitch, the width, and the height, corresponding to the wavelength of respective colors of the unit pixels, to form a suitable pattern shape.

The second polarizer 20 may use a polarizer typically used in the pertinent art which includes, for example, a polyvinyl alcohol ("PVA") film, which is formed by absorbing and elongating iodine, and a film protecting the PVA film.

An optical transmission axis of the first polarizer 10 and an optical transmission axis of the second polarizer 20 may be orthogonal to each other.

As including the first polarizer 10 having a wire grid pattern that may transmit or reflect polarized light in a selective manner, the display device according to the sixth exemplary embodiment may have high polarization efficiency, high transmittance, and a wide viewing angle.

Hereinafter, a display device according to a seventh exemplary embodiment will be described with reference to FIG. 12. The display device according to the seventh exemplary embodiment is an organic light emitting diode ("OLED") display device including the color conversion layer 200 of the fourth exemplary embodiment.

Figure 12:
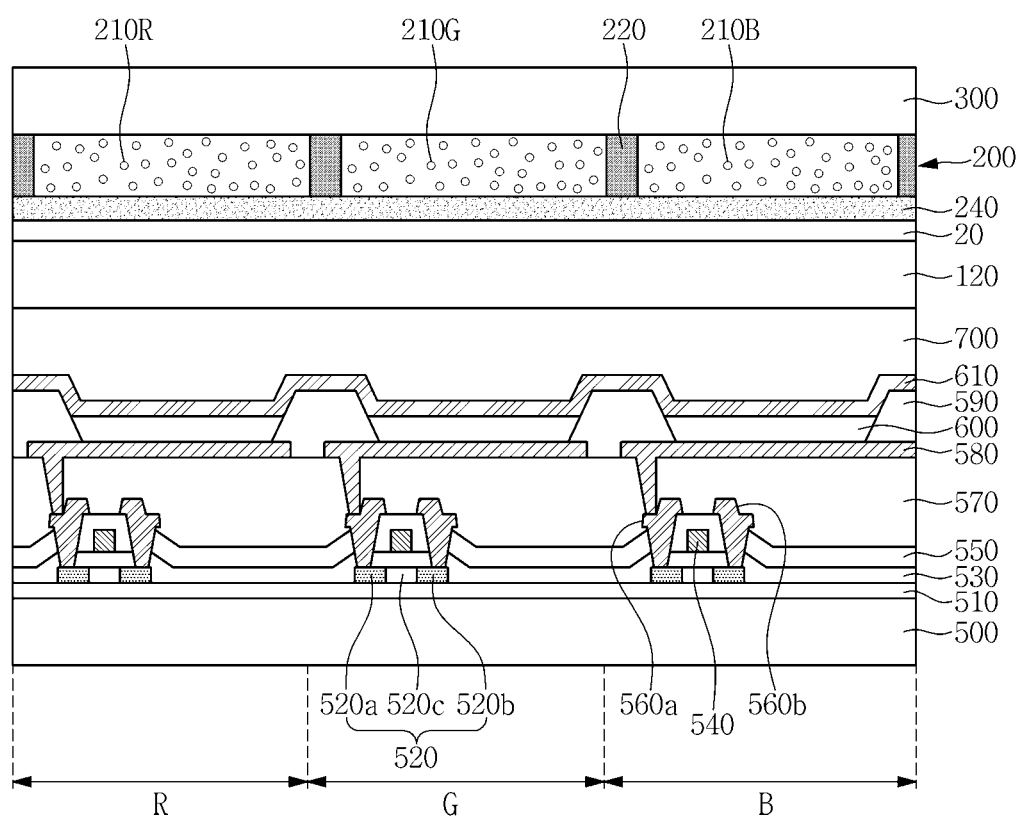
FIG. 12 is a cross-sectional view illustrating a display device according to a seventh exemplary embodiment.

FIG. 12 is a cross-sectional view to describe a configuration of an OLED according to the seventh exemplary embodiment, which will be described hereinbelow.

Referring to FIG. 12, a first substrate 500 having a red pixel area R, a green pixel area G, and a blue pixel area B may include an insulating material selected from the group consisting of: glass, quartz, ceramic, plastic, or the like. However, the seventh exemplary embodiment is not limited thereto, and the first substrate 500 may include a metal material such as stainless steel.

A buffer layer 510 is disposed over an entire surface of the first substrate 500. The buffer layer 510 is configured to protect a TFT, to be formed in a subsequent process, from undesirable materials that leaks from the first substrate 500.

Semiconductor layers 520 having source areas 520a, drain areas 520b, and channel areas 520c corresponding to each of the pixel areas R, G, and B are disposed on the buffer layer 510.

A gate insulating layer 530 is disposed on the semiconductor layers 520, and gate electrodes 540 are disposed on the gate insulating layer 530 corresponding to each of the channel areas 520c.

Subsequently, an insulating interlayer 550 is disposed to cover the gate electrodes 540, and source electrodes 560a and drain electrodes 560b electrically contacting the source areas 520a and the drain areas 520b, respectively, are disposed on the insulating interlayer 550.

The semiconductor layers 520, the source electrodes 560a, the drain electrodes 560b, and the gate electrodes 540 define TFTs on the pixel areas R, G, and B, respectively.

Subsequently, a planarization layer 570 is disposed thereon to cover the TFTs, and via holes are defined in the planarization layer 570 to expose the drain electrodes 560a, respectively.

The first electrodes 580, spaced apart from one another corresponding to each of the pixel areas R, G, and B, are disposed on the substrate in which the via holes are defined. Accordingly, the first electrodes 580 are electrically connected to the drain electrodes 560a, i.e., the TFTs, respectively, through the via holes. In an exemplary embodiment, the first electrodes 580 may have a structure in which a reflective metal layer, i.e., a reflective electrode including, e.g., silver, aluminum, a silver alloy, and an aluminum alloy which have high reflectance, and a transparent conductive layer, disposed on the reflective metal layer and having a high work function, are stacked. The first electrode 580 which is the reflective electrode may be an anode or a cathode.

A pixel defining layer 590, having an aperture exposing a portion of a surface of the first electrodes 580, is disposed on the substrate on which the first electrodes 580 are disposed. The pixel defining layer 590 may be an acrylic organic layer, for example.

Subsequently, an organic layer 600, including at least a blue light emitting layer is formed in each of the apertures.

The light emitting layer may include only hosts or only dopants, but such a light emitting layer is disadvantageous in that it has significantly low efficiency and luminance and exhibits characteristics of an excimer, in addition to the intrinsic characteristics of each molecule, due to a self-packing phenomenon that occurs among respective ones of the molecules. Accordingly, it is desirable that the light emitting layer is formed through doping dopants with hosts.

The blue light emitting layer may use an antracene-based material as a host material. Examples of the antracene-based material may include binaphtyl-methylantracene (MADN) and binaphthyl-t-butylantracene (TBDN).

The dopant material of the blue light emitting layer may use a light emitting material having a peak wavelength ranging from about 450 nm to about 475 nm in a light spectrum and having a main-peak area of about 80% or more, so as to enhance color purity and light emission efficiency.

The blue dopant may use a material having two or more aromatic amine units selected from the group consisting of: a perylene-based material, an anthanthrene-based material, a stilbene-based material, and a non-stilbene-based material. For example, the blue dopant may use a non-stilbene-based dopant.

The organic layer 600 may further include at least one of a hole injection layer, a hole transport layer, an electron transport layer, and an electron injection layer, in addition to the light emitting layer.

A second electrode 610 is disposed on the organic layer 600. In the present exemplary embodiment, the second electrode 610 is a transparent electrode, and light emitted from the organic light emitting layer is transmitted through the second electrode 610 to be emitted outwards. The second electrode 610 may be a cathode when the first electrodes 580 are an anode, and may be an anode when the first electrodes 580 are a cathode.

The second electrode 610 may include a transparent electrode including, for example, ITO or IZO, or may include a transmissive electrode, having a small thickness to transmit light, which includes a material selected from the group consisting of: Mg, Ag, Al, Ca, and alloys thereof that have low work functions. Accordingly, an OLED including the blue light emitting layer may be provided, having high color purity, high efficiency, and long life span.

A protective layer 700 is disposed on the second electrode 610. The protective layer 700 may protect interior components, such as the OLED from impact that may be externally imposed to the OLED display device.

Further, the OLED display device according to the seventh exemplary embodiment includes a blue OLED having high color purity and long life span and a color conversion layer having an expanded light emission area such that light efficiency may be improved.

As described hereinabove, an exemplary embodiment of the display device is susceptible to various modifications, for example, disposing a dichroic reflection layer on a lower surface of the color conversion layer, disposing a low refractive index layer in the color conversion layer, and reducing a partition wall of the color conversion layer. Improvement in light extraction efficiency is measured for each exemplary embodiment, the results of which are described hereinbelow in Table 1.

TABLE 1

| Light amount (measured) | | Dichroic reflection layer | | | | |
|---|---|---|---|---|---|---|
| | | Not applied | Applied | | | |
| Width of partition wall (μm) | | 72 | 72 | 49 | 26 | 0 |
| Low refractive index layer | Not applied | 100% | 115% | 125% | 142% | 160% |
| | Applied | 120% | 132% | 143% | 162% | 177% |

Referring to Table 1, it is verified that a display device including the dichroic reflection layer on the lower surface of the color conversion layer is increased by about 15% in terms of a light amount, a display device including the low refractive index layer in the color conversion layer by about 20% in terms of a light amount, and a display device including both of the dichroic reflection layer and the low refractive index layer by about 32% in terms of a light amount.

In an exemplary embodiment, when the dichroic reflection layer is provided on the lower surface of the color conversion layer, display devices including partition walls, among the color conversion layers, of which widths are reduced from about 72 μm to about 49 μm, about 26 μm, and about 0 μm are increased by about 10%, about 27%, and about 45%, respectively, in terms of a light amount.

When both of the dichroic reflection layer and the low refractive index layer are provided, display devices including partition walls, among the color conversion layers, of which widths are reduced from about 72 μm to about 49 μm, about 26 μm, and about 0 μm are increased by about 11%, about 30%, and about 45%, respectively, in terms of a light amount.

As such, an exemplary embodiment of a display device may be improved in terms of light extraction efficiency by reducing the partition wall of the color conversion layer to expand light emission area.

As set forth above, in a display device according to one or more exemplary embodiments, the light emission area may be expanded by adjusting the width of the partition wall among the color conversion layers such that light efficiency may be improved.

While the inventive concept has been shown and described with reference to the exemplary embodiments thereof, it will be apparent to those of ordinary skill in the art that various changes in form and detail may be made thereto without departing from the spirit and scope of the inventive concept.

What is claimed is:

1. A display device comprising:
a first substrate;
a second substrate facing the first substrate;
a light amount control layer between the first substrate and the second substrate;
a plurality of first lines disposed on the first substrate and extending in a first direction and a plurality of second lines disposed on the first substrate and extending in a second direction which intersects the first direction;
a light blocking member disposed on the first substrate and overlapping at least one of the first line and the second line;
a plurality of color conversion layers on the second substrate in respective pixel areas; and
a partition wall among the plurality of color conversion layers, corresponding to the plurality of first lines and the plurality of second lines, the partition wall comprising two first portions adjacent to each other and extending in the first direction and two second portions adjacent to each other and extending in the second direction to intersect one another to form a lattice form, a second width of each of the two second portions being greater than a first width of each of the two first portions,
wherein the second width of each of the two second portions is the same as a width of the light blocking member corresponding to each of the two second portions and the first width of each of the two first portions is less than the width of the light blocking member corresponding to each of the two first portions.

2. The display device as claimed in claim 1, further comprising a polarizer between the second substrate and the light amount control layer.

3. The display device as claimed in claim 2, wherein the color conversion layer is on a lower surface of the second substrate.

4. The display device as claimed in claim 3, further comprising a dichroic reflection layer between the color conversion layer and the polarizer.

5. The display device as claimed in claim 1, further comprising a polarizer above the second substrate.

6. The display device as claimed in claim 5, wherein the color conversion layer is above an upper surface of the second substrate.

7. The display device as claimed in claim 6, wherein the color conversion layer is between the second substrate and the polarizer in a third direction vertical to the first direction and the second direction.

8. The display device as claimed in claim 6, wherein the polarizer is between the second substrate and the color conversion layer.

9. The display device as claimed in claim 8, further comprising a third substrate above the color conversion layer.

10. The display device as claimed in claim 1, wherein the color conversion layer further comprises a low refractive index layer.

11. The display device as claimed in claim 10, wherein the low refractive index layer is on surfaces of the color conversion layer except a surface of the color conversion layer facing the light amount control layer and disposed adjacent to the light amount control layer.

12. The display device as claimed in claim 1, wherein a portion of the partition wall overlapping the second line has the second width greater than the first width of a portion of the partition wall overlapping the first line.

13. The display device as claimed in claim 1, wherein the plurality of the first lines are is a gate lines, and the color conversion layer has substantially a same color in an upper portion and a lower portion with respect to the gate lines.

14. The display device as claimed in claim 1, wherein the plurality of the first lines are data lines, and the color conversion layer has substantially a same color in a left portion and a right portion with respect to the data lines.

15. The display device as claimed in claim 1, wherein the color conversion layer comprises a phosphor in an area defined by the partition wall.

16. The display device as claimed in claim 15, wherein the phosphor comprises at least one of a red phosphor, a green phosphor, and a blue phosphor.

17. The display device as claimed in claim 1, wherein the color conversion layer comprises a phosphor and a transparent layer.

18. The display device as claimed in claim 1, further comprising a plurality of thin film transistors at intersecting areas between the plurality of the first lines and the plurality of the second lines; and a plurality of pixel electrodes connected to the plurality of the thin film transistors, respectively.

19. The display device as claimed in claim 1, wherein the light amount control layer comprises liquid crystal molecules.

20. The display device as claimed in claim 1, wherein the light amount control layer comprises a blue organic light emitting layer.

* * * * *